Figure 7:
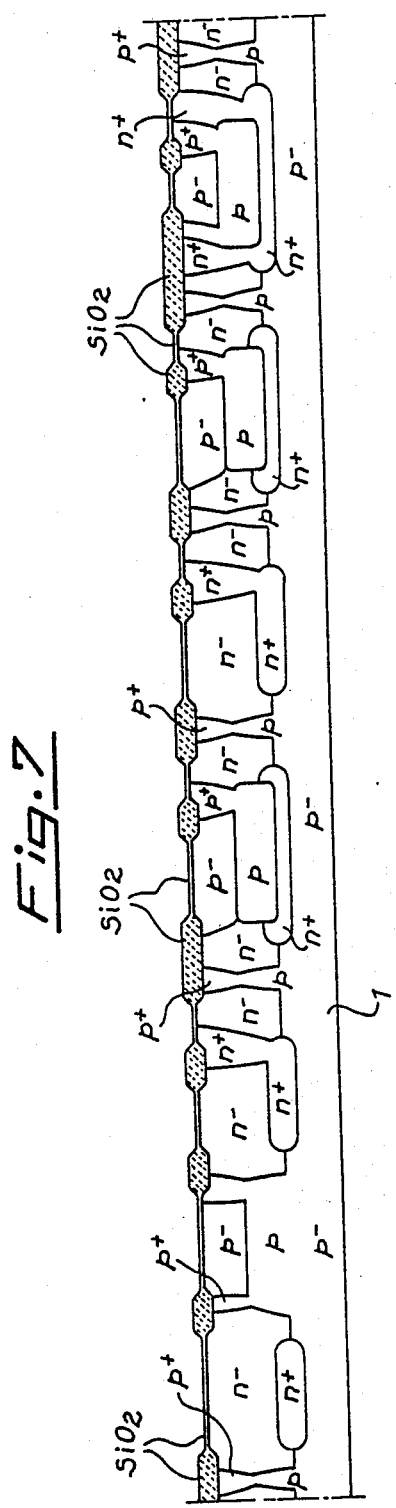

United States Patent [19]

Bertotti et al.

[11] Patent Number: 4,887,142

[45] Date of Patent: Dec. 12, 1989

[54] MONOLITHICALLY INTEGRATED SEMICONDUCTOR DEVICE CONTAINING BIPOLAR JUNCTION TRANSISTORS, CMOS AND DMOS TRANSISTORS AND LOW LEAKAGE DIODES AND A METHOD FOR ITS FABRICATION

[75] Inventors: Franco Bertotti, Milan; Carlo Cini, Cornaredo; Claudio Contiero, Buccinasco; Paola Galbiati, Monza, all of Italy

[73] Assignee: SGS Microelettronica S.p.A., Italy

[21] Appl. No.: 276,890

[22] Filed: Nov. 28, 1988

Related U.S. Application Data

[63] Continuation of Ser. No. 6,453, Jan. 23, 1987, abandoned.

[30] Foreign Application Priority Data

Jan. 30, 1986 [IT] Italy ............................. 19231 A/86
Jan. 30, 1986 [IT] Italy ............................. 20779/86[U]

[51] Int. Cl.⁴ ............................................. H01L 27/02
[52] U.S. Cl. .................................... 357/43; 357/42; 357/41; 357/44; 357/48
[58] Field of Search ..................... 357/43, 44, 42, 48

[56] References Cited

U.S. PATENT DOCUMENTS 4,546,370 10/1985 Curran ............................... 357/43
4,589,004 5/1986 Yasuda ............................ 357/43 X Primary Examiner—Martin H. Edlow
Attorney, Agent, or Firm—Bierman and Muserlian

[57] ABSTRACT

Disclosed is a monolithic integrated semiconductor device which may contain specimens of seven different circuit components; namely: lateral N-MOS and lateral P-MOS transistors (CMOS), vertical N-DMOS and vertical P-DMOS transistors, vertical NPN bipolar transistors, vertical PNP bipolar transistors with isolated collector and low leakage junction diodes as well as a process for fabricating such a device.

1 Claim, 5 Drawing Sheets

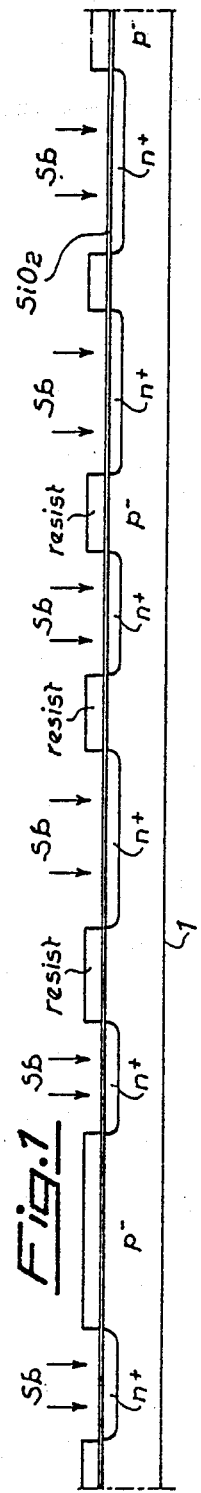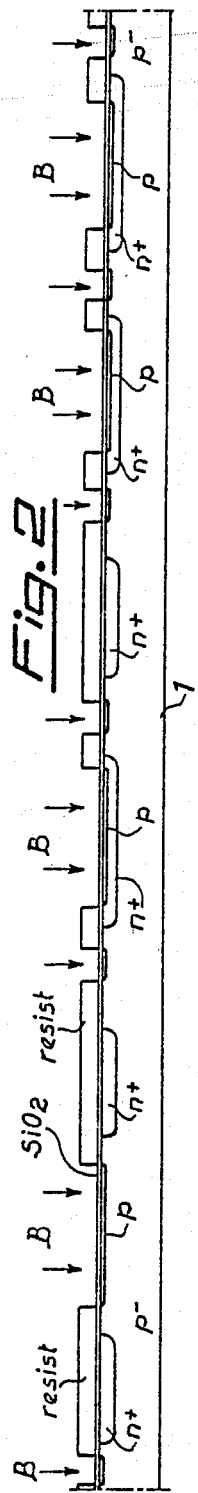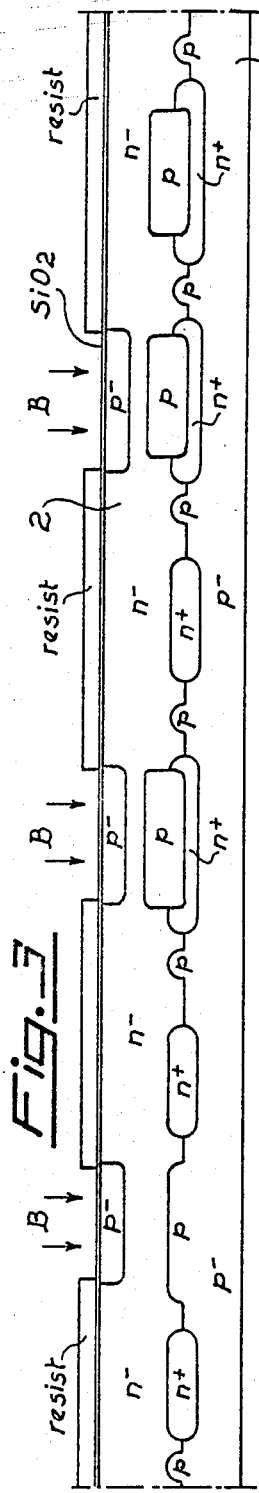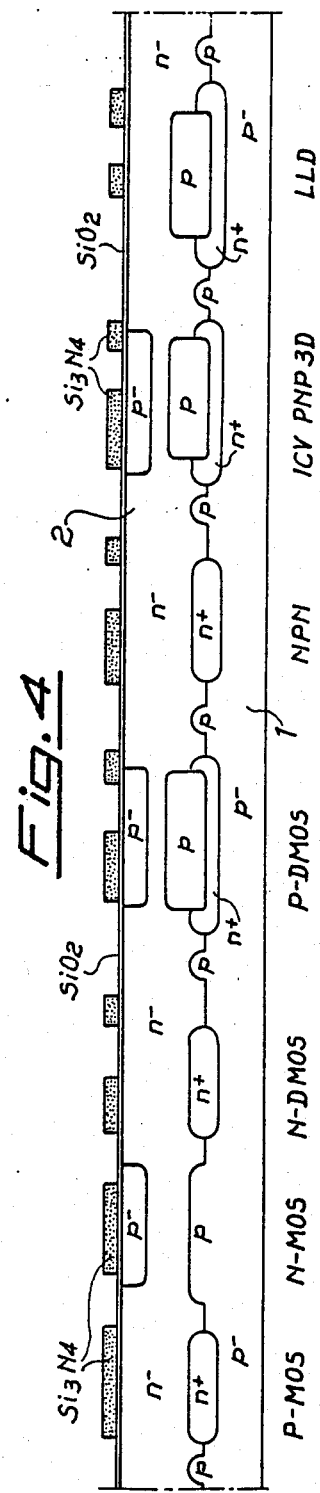

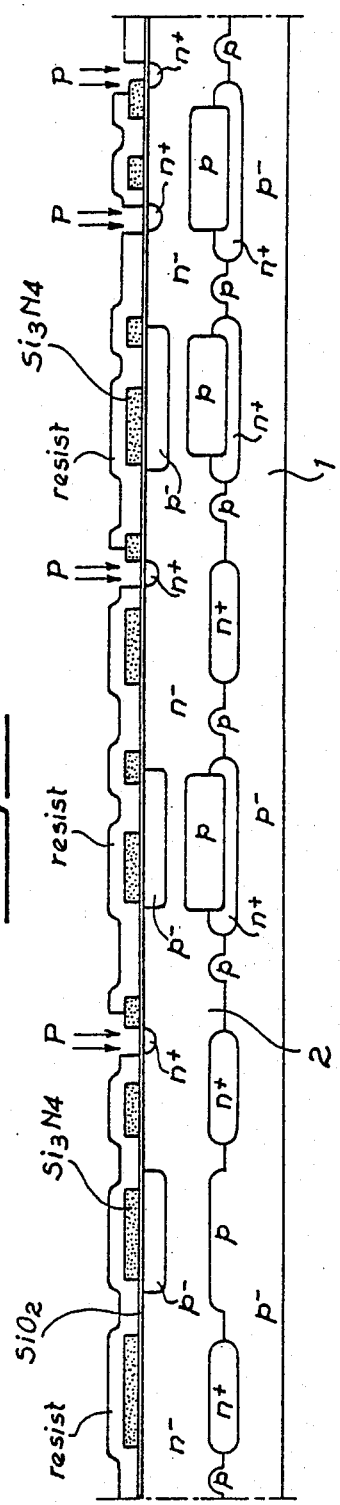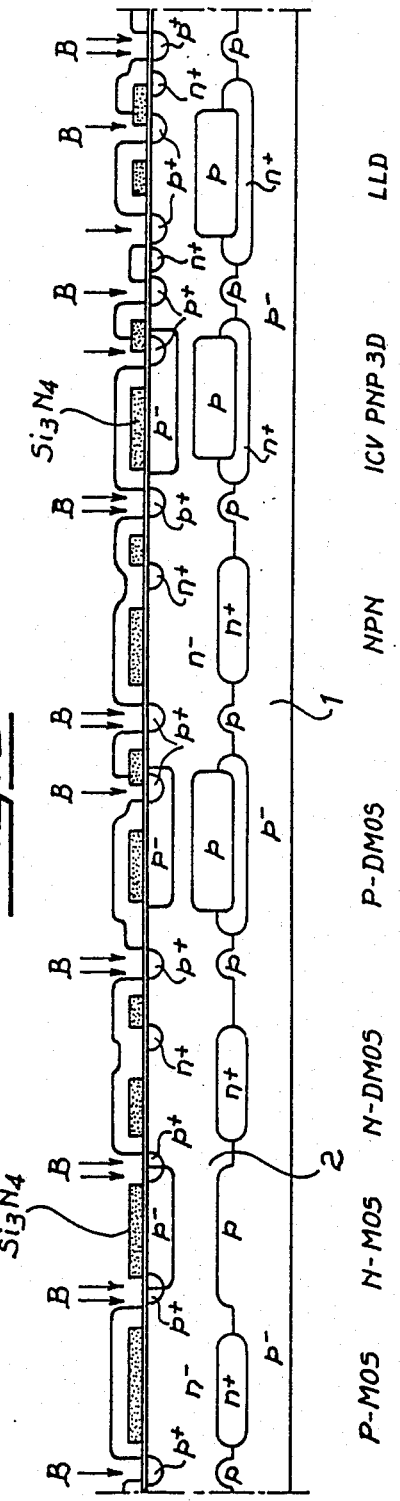

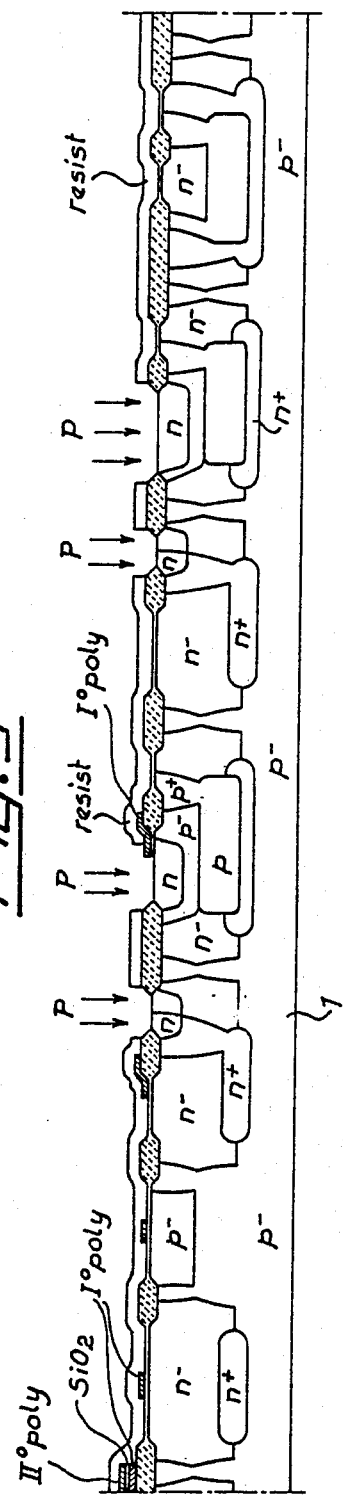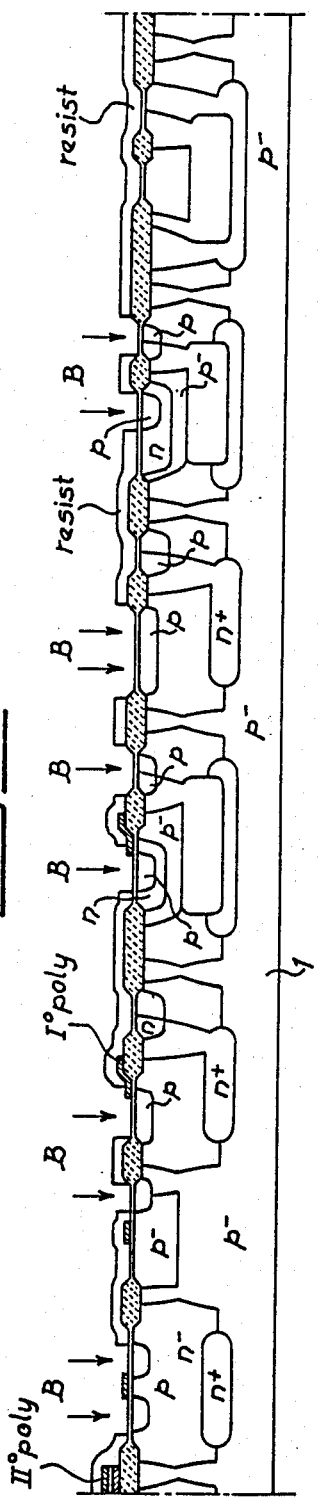

MONOLITHICALLY INTEGRATED SEMICONDUCTOR DEVICE CONTAINING BIPOLAR JUNCTION TRANSISTORS, CMOS AND DMOS TRANSISTORS AND LOW LEAKAGE DIODES AND A METHOD FOR ITS FABRICATION

PRIOR APPLICATION

This application is a continuation of U.S. patent application Ser. No. 006,453 filed Jan. 23, 1987, now abandoned.

The present invention relates generally to monolithic integrated circuits comprising components of different kind and, in particular, integrated circuits of the MOS/bipolar type, that is containing bipolar type components and MOS type components and, more precisely, CMOS and complementary DMOS components.

Multiple and distinct requirements of analog circuits for signals handling or of complex systems which may comprise, for example, measurement, signals handling, computation, logic and other similar functions, notably may be separately fulfilled in an effective way by means of semiconductor devices having very different structures and usually fabricated in accordance with technologically different processes. For example, in analog circuits, the active components made in accordance with the bipolar technology are often preferred to the CMOS components because the bipolar junction transistors have a high transconductance, low noise factor (1/f) and the base-emitter voltage may be matched with high precision. Viceversa CMOS transistors, though failing to match certain characteristics of the bipolar transistors, allow a greater density, a high noise threshold and low dissipation, thus making themselves particularly suitable for logic and memory circuits. Moreover vertical DMOS transistors result particularly suited where relatively high voltage operation is required and where a high switching speed is required.

On the other hand, the integration process of all the components of a particular circuit on a single chip of single crystal semiconductor material, restricts the adoption of components having compatible structures and therefore capable of being integrated on the same substrate of semiconductor material. That is all the components of the circuit to be integrated, must be able to be fabricated on the same substrate by means of a series of working stages of which, the essential ones, in terms of compatibility, are identifiable by a certain number of masks utilized, according to a certain sequence, for defining, by means of photolithographic techniques, certain areas on the surface of the wafer of semiconductor material through which areas the necessary implants and diffusions of acceptor or donor dopants are produced for creating in the semiconductor as many zones or regions having the relative desired spatial arrangement, dimensions and electrical characteristics, as well as areas destined for the formation of the electrodes and of the contacts, for the formation of passive elements such as capacitors, resistors, etc..

Therefore, in designing a particular circuit section there are limitations in making economically available components of the most suitable type for the various portions of the circuit in so far it is necessary to make consistent such requirements with the selection of a particular fabrication technology for the integrated circuit.

Lately have been devised integrated circuit fabrication processes which have permitted the formation on the same chip of some bipolar type components together with some CMOS type components and, more recently in some instances, also of components of the DMOS type more suitable for high operation voltages.

Publications such as: "Mixed Process Puts High Power Under Fine Control" by Thomas E. Ruggles and Gary W. Fay, "Electronic Desing" of 31.3.1982; "DMOS CMOS Process Points To Highest Power Rating For 'Smart' Power Control" by Stephan Ohr, appeared in the feature "News" of "Electronic Desing" of 9.2.1984; "An Analog Technology Integrates Bipolar, CMOS and High Voltage DMOS Transistors" by Surinder Krishna, James Kuo and Isaura Servin Gaeta, "IEEE Transactions on Electron Devices", Vol. ED. 31, No. 1 of January 1984; the european patent application No. 8290244.4 (publication No. 0 117 867 A1) with title "Semiconductor Device"; the european patent No. 0 068 945 B1 with title "Transistor Bipolaire à Commande par Effet de Champ au Moyen d'une Grille Isolé"; the european patent application No. 84400220.4 (publication No. 0 118 336 A1) with title "High Voltage MOS/Bipolar Power Transistor Apparatus"; and US Pat. No. 4,546,370 with title "Monolithic Integration of Logic, Control and High Voltage Interface Circuitry", are examples of as many fabrication processes which have permitted the formation of certain components of different structure in the same integrated circuit by means of fabrication operations known per se.

The present inventors have recognized in the known proposals important limitations. For example, many of said devices have been conceived on the basis of the fabrication sequence typical of the metal gate CMOS process leading to decisively inferior characteristics of the single components with respect to those obtained by means of the more refined silicon gate processes. Many of such devices, with a single level of metal, do not permit on the other hand, the formation of capacitors with a high degree of reproducibility of their capacitance value. Moreover a severe limitation of such known devices is due to the fact that none of them offers to the integrated circuit designer the availability of a truly complete range of components for monolithically integrating on a single chip high quality analog or analog/digital signals handling circuit sections.

An objective of the present invention is that of providing a semiconductor device capable of containing a more complete range of active and passive components of different type in an integrated form on the same substrate than that offered by the known devices as well as that of providing a process for fabricating such a device and requiring a restrained number of masking steps.

The device object of the present invention may contain, in integrated form on a single chip, one or more exemplars of each of the circuit components belonging to the group composed by: lateral CMOS transistors, complementary vertical DMOS transistors, vertical NPN transistors, vertical PNP transistors with isolated collector and low leakage junction diodes. The gate electrode of the MOS components is of polycrystalline silicon (poly) and, preferably, the device is provided of a second level of polycrystalline silicon, what allows an easy integration, in the same device, of passive components having a high reproducibility such as capacitors (utilizing the two levels of poly as armatures) and resistors, besides allowing the implementation of field plates for reducing the intensity of the electric field locally enhanced in correspondence of the edges of the DMOS structures.

The device of the present invention allows to take advantage, on a single integrated structure, of a range of circuit components of different type, each characterized by particular performances which make them individually suited to meet different requirements of distinct circuit sections of complex systems.

Together with lateral CMOS transistors characterized by a high switching speed and therefore suited to be utilized in control, decision (intelligence) and in signal handling circuits, one may thus have available vertical DMOS transistors, both p-channel as well as n-channel, having, in particular, a high breakdown voltage in so far the latter is determined, in contrast with what takes place in lateral MOS transistors, essentially by the bulk resistivity of the drain region and by the curvature of the p-n junction. Moreover vertical DMOS transistors possess remarkable switching speed and thermal stability, characteristics these which make them particularly suited for output stages capable of controlling voltages in the order of 100 Volts on even strongly capacitive loads.

The device of the invention may contain, moreover, vertical NPN bipolar transistors with high current gain and vertical PNP bipolar transistors with isolated collector both presenting cut-off frequencies in the order of 0.5–1.5 GHz and being very useful for obtaining, for example, wide-band amplifiers.

Another circuit component which may be contained in the device and which is extremely useful in very frequent circuit situations (i.e. driving of inductive loads) is the low leakage junction diode. In fact, in integrated circuits, the diodes which are utilized by the circuit itself are often the principal cause of large leakage currents towards the substrate because of the switching on of the relative parasitic transistor, under forward bias conditions of the diode, which causes a leakage of current towards the substrate. The low leakage diode is, on the contrary, characterized by a structure which provides a "screen" effective in minimizing such leakage currents.

The presence of a double layer of "poly" (that is of polycrystalline silicon) allows, furthermore to obtain capacitors of high reproducibility offering a specific capacitance per unit of area very constant and equal to about 0.2–0.5 pf/mil$^2$ (where mil means a thousandth of an inch that is 25.4 × 10$^{-3}$ mm) when utilizing the two superimposed levels of poly as armatures of the capacitor.

The possibilities of implementing resistors are also broadened by the availability of two distinct layers of poly which may be individually made with different resistivities.

The device according to the present invention offers, for the first time in a monolithically integrated form, a range of components such as to fulfill, in the best manner, substantially any circuit requirement which may be found in implementing complex systems for the handling of signals and represented by:

low leakage junction diodes (LLD);
lateral P-MOS transistors; ⎫
⎬ that is CMOS transistors
lateral N-MOS transistors; ⎭
vertical N-DMOS transistors;
vertical P-DMOS DMOS transistors;

-continued vertical NPN bipolar transistors; and
isolated collector, vertical PNP bipolar transistors.

The availability of devices made in accordance with the present invention which may comprise the above noted seven distinct components, offers great advantages to the designer of integrated circuits (C.I.).

In principle any design may be tackled without compromises because there exist the suitable component for every circuit situation. That is one has the right component for each requirement. Of course not all these components must be utilized all the times but case by case one decides which and how many of the above mentioned seven components are to be used. For better illustrating the aspects and advantages of the present invention some application examples of devices made in accordance with the present invention may be indicated as follows.

For example, in a telephone one needs a circuit capable of amplifying low level audio signals utilizing the lowest possible supply voltage (about 2–3 V), filtering circuits and an output stage with a large dynamic characteristic of the voltage of the output signal for providing the driving current of the capsule functioning as the loudspeaker of the receiver of the telephone. Components suitable for satisfying such technical requisites are: bipolar transistors in the input stage because of their low noise and offset characteristics, CMOS transistors for the filtering section utilizing the switched capacitors technique and again bipolar transistors in the output stage (vertical PNP with isolated collector and vertical NPN) for obtaining a high dynamics and a high output current.

In accordance with the present state of the art these functions are performed utilizing two "chips": one bipolar and the other CMOS. With a device made in accordance with the present invention and containing CMOS transistors, bipolar vertical transistors NPN and PNP with isolated collector, it is possible to make the entire circuit on a single "chip".

In the area of the control and trimming systems there exist many possibilities for the application of "intelligent" circuits for driving inductive loads. For these applications it is necessary to have bipolar transistors for the input stage, CMOS transistors for the signal handling section and for "talking" with the microprocessor and finally bipolar transistors, preferably vertical, in the output stage for driving the load at high levels of current. Moreover it is necessary to use recirculation diodes for avoiding the output going above and below the supply voltage by a $V_{BE}$ (of the clamping diode). In these circuit situations it is indispensable to use low leakage diodes (LLD) for reducing the power dissipation which results excessive in diodes of normal type because of the parasitic PNP transistor which is excited and loses current towards the substrate. In this case also a device made in accordance with the present invention and containing bipolar junction transistors: vertical NPN and vertical PNP with isolated collector, CMOS transistors and LLD diodes allows to integrate the entire circuit on a single chip.

In the area of circuits for driving displays the nature of the loads to be driven may be extremely various while a rather high level of output voltage is required. For these applications a device made in accordance with the present invention may contain lateral CMOS transistors for the signal handling section in a exclusively digital way while the output stage will be made advantageously with complementary vertical DMOS transistors capable of operating with output voltages of about 40–50 Volts.

The FIGS. from 1 to 12 are schematic vertical sections showing the general architecture to the device of the present invention by illustrating, in a sequence, the way in which the different components may be integrated on a same substrate.

The series of FIGS. from 1 to 12 is intended to represent, though in a necessarily schematic way, the succession of operations or stages of manufacture of the fabrication process object of the present invention, by showing on and on, through a sequence of vertical sections of the wafer being processed, the way said seven different components, the abbreviated denominations of which are indicated at the bottom of each table of drawings in correspondence of the respective regions, are implemented on a single monolithic substrate. The illustrations are simplified and do not comprehend special well known considerations such as for example optional adjustment ion implant operations, particular techniques for opening the contacts, etc.; moreover the diffusions of doping elements are considered complete in the relative cross-sections even though in practice some diffusions are interrupted for performing other operations of ion implant or deposition from gaseous phase and may not be complete until the end of the subsequent thermal cycles to which is subjected the device being fabricated. In order not to overload with symbols the figures, especially those relative to the final stages of fabrication, the type of electrical conductivity of the various regions is not repeatedly indicated for all domains or regions of the single crystal of semiconductor material. Where this is not expressly indicated, the type of conductivity may easily be deduced by observing the preceding figures as the series of figures is realized as a sequence of the "same" section of the wafer through the various modifications it undergoes during the fabrication process.

According to a presently preferred embodiment of the device of the present invention, the starting material is a <100> slice or wafer of p− silicon with a resistivity comprised between 1 and 5 Ω.cm of a silicon single crystal obtained by the Czochralski's method.

After having proceeded to oxidize the surface of the wafer, the first masking operation is performed according to known techniques which contemplate depositing a layer of photosensitive material (commonly called "photoresist" or more briefly "resist") on the surface, illuminating this layer through the appropriate one of the masks prepared in advance for the fabrication process (typically made with a glass plate onto which has been deposited an opaque material, i.e. chromium, for defining the shape or profile of the areas), and removing the photosensitive material which has not been illuminated in case negative resist is used, or viceversa, in case a positive resist is used, for exposing the areas which are to be defined on the surface of the wafer.

The layer of resist, on areas where it is left, constitutes the mask that is the masking material for the technological operation which follows i.e. implanting of ions of antimony in the silicon single crystal in correspondence of the unmasked areas and the subsequent diffusion thermal treatment (performed after having removed the layer of residual resist) at about 1200° C. for about 60 minutes for the formation of the so-called n+ buried layers. Such an operation is shown in FIG. 1 wherein the starting slice of p− silicon is indicated with 1 and wherein are further indicated the layer of oxide (SiO₂) preformed on the surface of the silicon, the photoresist mask (resist); the atoms of antimony being implanted and after diffused into the single crystal.

Successively a new layer of photoresist is deposited and, following the same technique described above, the second mask is prepared. After the masked wafer is subjected to plasma attack until the layer of oxide (SiO₂) is completely removed in correspondence of the unmasked areas thus exposing the single crystal.

As shown in FIG. 2, ions of boron are implanted through the relative areas for forming the p buried layer and the bottom isolations.

The residues of photoresist and of oxide are then completely removed by plasma attack and a layer of n−silicon (shown also with 2 in the figures) with a resistivity comprised, preferably, between 1 and 3 Ω·cm and a thickness comprised between 9 and 11 micrometers is grown epitaxially on the surface of the starting single crystal of p− silicon. The surface is then oxidized by treating at a temperature of about 920° C. in presence of water vapor till forming a layer of silicon oxide (SiO₂) of about 1500 Å. The third masking operation is then performed, according to the same technique described before, for defining the areas through which will be formed regions of p− silicon for forming the so-called p− tubs ("p-well") which constitute the body regions for N-MOS, the drain regions for P-DMOS and the collector regions for ICV PNP 3D (isolated collector vertical PNP-triple diffused transistors). As shown in FIG. 3, to the boron implant which is performed, preferably, at 80 KeV in such a way as to obtain a total quantity of impurities per unit area in the crystal of about $Q = 10^{13}$ cm$^{-2}$, and after having removed the resist constituting the mask during the boron implant for the p− tubs, a brief thermal treatment of partial diffusion may be performed. After this diffusion a layer of silicon nitride (Si₃N₄) of a thickness of about 3000 Å is deposited, commonly from vapor phase, on the surface of the wafer being processed. By means of a fourth masking operation the areas destined for the formation of the successive diffusions are defined by the resist and a plasma attack is performed until removing completely the nitride from the areas unprotected by the resist mask. After these operations the section presents itself as shown in FIG. 4.

A fifth masking operation, as shown in FIG. 5, followed by a brief attack for removing the layer of SiO₂, presets the wafer for the phosphorus implant necessary for realizing the deep n+ "sinker" diffusions for the electrical contact with the respective n+ buried layers. The implant is carried out at 80 KeV in such a way as to obtain in the diffused region a total quantity of impurities per unit area in the crystal of about $Q = 10^{15}$ cm$^{-2}$ Simultaneously to these operations, besides presetting for the sinker diffusions one presets also the formation of what will become later a deep n+ diffused region, shaped as a continuous wall, of electrical contact and shield of the anoderegion of the structure of the low leakage diodes (LLD).

A sixth masking operation, as shown in FIG. 6, prepares the wafer for the boron implant necessary for making the deep p+ diffusions of contact with the p buried layers and for the top isolations. The boron implant is carried out at 40 KeV in such a way as to obtain in the region a specific charge of about $Q = 10^{15}$ cm$^{-2}$.

Simultaneously the wafer is also boron implanted in correspondence of a region which will become the anodic region of p+ silicon of the low leakage diode (LLD) which will take the shape of a wall region disposed internally of the n+ wall region of contact and shield, for making which the relative phosphorus implant was effected in the preceding operation.

After removing the masking resist a thick layer of field oxide is grown in the areas not covered by the nitride ($Si_3N_4$) by treating at about 1000° C. in presence of water vapor till obtaining a growth of the original layer of oxide ($SiO_2$) such as to reach a thickness of at least about 1 micrometer.

Diffusion of the dopants implanted during the preceding operations continues obtaining the desired expansion of the p+ isolation regions, of the p− drains, of the n+ sinker diffusions and of the p+ anode wall region of the structure of the low leakage diode (LLD). After, a chemical attack is carried out for completely removing the nitride and continued for attacking the silicon oxide until exposing the silicon in the areas between the zones covered by the thick layer of field oxide. Under particular conditions of freedom from impurities, one proceeds to form the gate oxide by treating at about 875° C. in presence of steam forming a layer of silicon oxide of (gate oxide) of about 700 Å.

At the end of such treatments the section presents itself as in FIG. 7.

As it may be observed, the top isolation p+ diffusions have joined with the p bottom isolations diffusions to form the desired separation wall among the various adjacent components being fabricated. Also the other deep diffusions, that is the sinker n+ diffusions of contact with the n+ buried layers, the p+ contact diffusions with the p buried layer, the p− tub regions and the wall shaped p+ anode region of the LLD diode have extended, at the same time, until reaching dimensions such as to determine, substantially, the desired spatial configuration for said deep diffused regions.

What follows then are the operations of depositing a layer of polycrystalline silicon with thickness of about 4500 Å from vapor phase, of successively doping the layer of polycrystalline silicon with phosphorus, of masking and attacking in plasma for removing the polycrystalline silicon from the unmasked areas, of removing the masking resist and of superficially oxidizing said first layer of polycrystalline silicon (I poly) by means of a treatment at about 1100° C. in oxidizing atmosphere of about 20 minutes. Such a first layer or first level of poly being also called gate poly in so far portions of such first level of poly constitute as many gate electrodes of the MOS transistors being fabricated.

Besides constituting the gate electrodes of the MOS transistors, the I poly may be utilized in other zones of the surface of the silicon dice for forming passive components such as for example capacitors and resistors. In fact, by repeating the operations of deposition, doping, masking (utilizing obviously an appropriately prepared mask) and of successive plasma attack, it is possible to place a second layer of polycrystalline silicon (II poly) over the I poly (which, as said before, has been purposely oxidized at its surface) in correspondence of the areas where capacitors are to be formed with easily reproduceable and precise values of capacitance by utilizing the two levels of poly as armatures.

Preferably the I poly, that is the gate poly, will be doped with phosphorus in such a way as to obtain a surface resistivity of about 30–40 $\Omega/\square$, while the II poly may advantageously be doped in a lesser amount than the I poly and/or have a smaller thickness in such a way as to determine a greater value of sheet resistivity, preferably of about 80–90 $\Omega/\square$. Such an expedient allows increased possibilities of choice in designing and forming integrated resistors.

Figure 8:
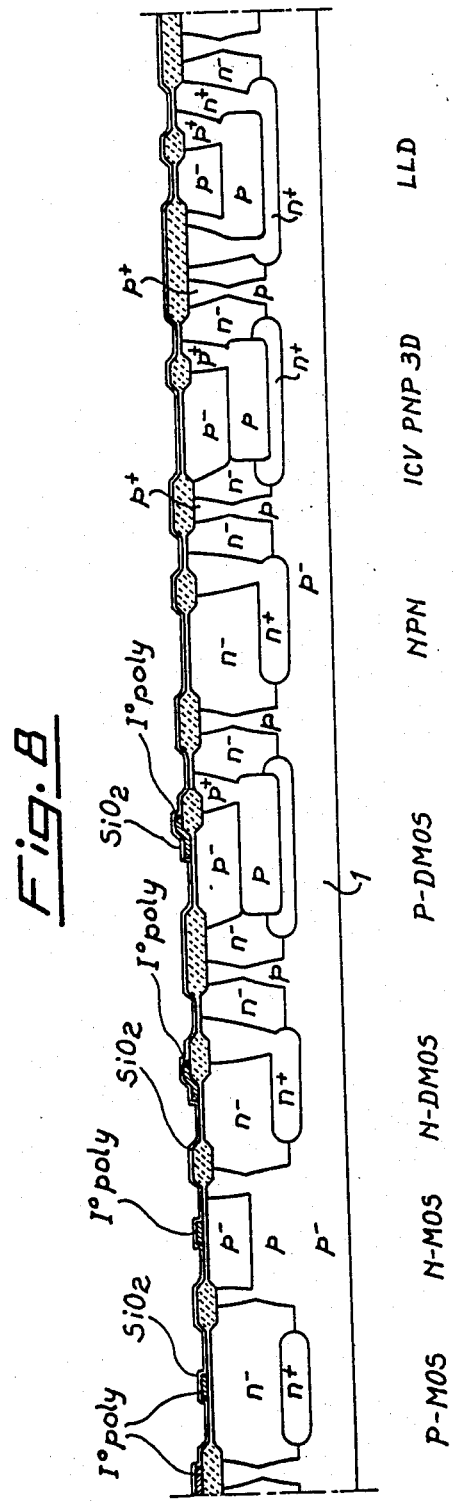

After completion of these further operations, the section will appear as shown in FIG. 8 and the fabrication process proceeds with the operations for forming the shallow diffusions in correspondence of the "active" regions of the various components.

By means of a new masking operation, one defines the areas for forming the n body regions of P-DMOS transistors, of the drain enhancement regions of N-DMOS transistors, of the collector enhancement regions of NPN transistors and of the base regions of ICV PNP 3D transistors. The oxide is attacked until exposing the silicon in such areas and successively phosphorus is implanted at 100 KeV through such exposed areas to obtain a total quantity of impurities per unit area $Q \simeq 10^{13}$ cm$^{-2}$ in the diffused region of the solid, proceeding further with a thermal treatment of diffusion as illustratively shown in FIG. 9.

After having removed the mask of resist and re-oxidized the surface of the silicon in the areas implanted with phosphorus during the preceding fabrication operation, a new masking operation is performed followed by a boron implant operation and thermal treatment of diffusion for forming p regions of body for N-DMOS transistors, of enhancement for the anode contact of low leakage diodes, of base of NPN transistors, of source and drain of P-MOS transistors, of source and of drain enhancement of P-DMOS transistors, of emitter and of enhancement region of collector of ICV PNP 3D transistors and of enhancement of the contact of the well region of N-MOS transistors, as shown in FIG. 10. The boron implant takes place at 80 KeV for obtaining a charge of about $Q = 5 \times 10^{13}$ cm$^{-2}$.

Figure 11:
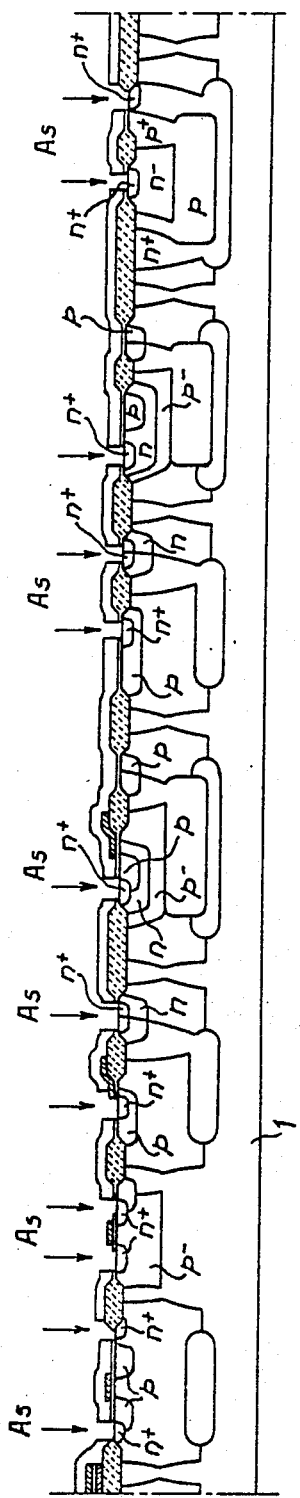

By means of a new masking operation areas are defined for the formation of as many shallow n+ regions relative to n+ regions of channel stopper of P-MOS transistors (disposed between the p drain and source regions and the field oxide adjacent to these regions), of enhancement for the body contact of P-DMOS transistors, of source and drain regions of N-MOS transistors, of source and drain enhancement regions of N-DMOS transistors, of emitter of NPN transistors and to n+ regions of contact relative to the collector of NPN transistors, to the base of ICV PNP 3D transistors, to the anode and to the cathode of LLD diodes. The oxide is attacked in plasma until exposing the silicon in such areas and successively arsenic is implanted through said exposed areas at 50 KeV in such a way as to obtain a charge corresponding to a total quantity of impurities per unit area of about $Q = 5 \times 10^{15}$ cm$^{-2}$ in the solid and proceeding further, after having removed the masking resist, with a thermal treatment of diffusion as shown in FIG. 11.

After, an insulating layer is deposited on the whole surface, preferably by depositing from vapor phase a first layer of silicon oxide with a thickness of about 5000 Å and, a second layer of silicon oxide doped with phosphorus and boron (commonly known by the abbreviated symbol PBSG from Phosphorus Boron Silicon Glass) having a thickness of about 5000 Å.

A new masking operation defines the areas where as many electrodes will be formed and a subsequent plasma attack of the insulating layer in correspondence of the unmasked areas until exposing the underlying silicon produces the desired holes through which the electrodes are formed (opening of the contacts).

A layer of metal is thence deposited by means of a sputtering technique, preferably an alloy of Al (99%)/Si (1%) and by means of a new masking operation the deposited metal is attacked and removed completely from the unmasked areas thus forming in this way the various electrodes of the different integrated components.

Figure 12:
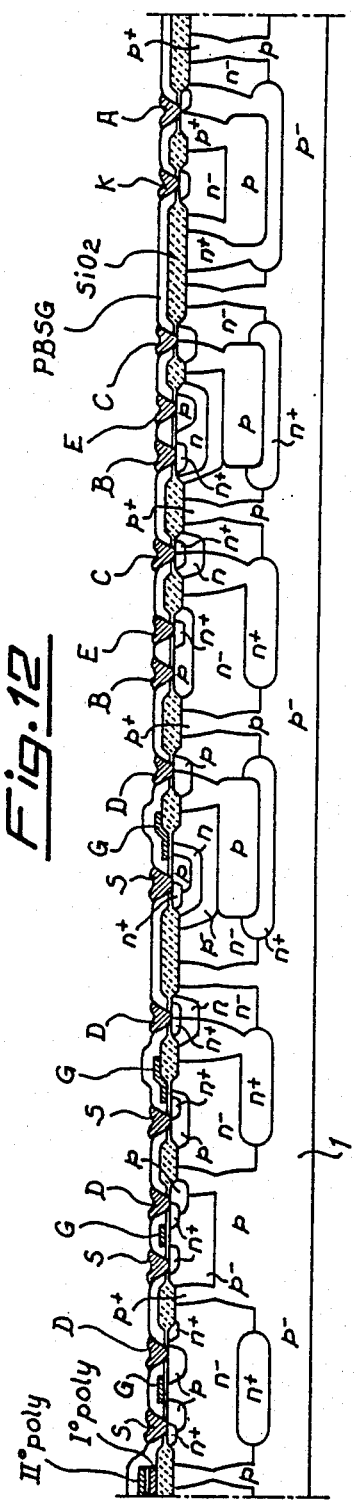

FIG. 12 shows the section of the device at this point of the fabrication process. The various electrodes of the different components are indicated by the usual distinctive letters.

The fabrication process contemplates, further, a heat treatment favoring the formation of an alloy Al/Si at the interface between the electrodes and the silicon; the deposition from vapor phase of a final insulating layer of silicon oxide doped with phosphorus or an insulating layer of silicon nitride and the opening of the pads contacts that is of the areas for the electrical connections of the various leads of the integrated circuit, by means of at least a further masking operation.

The different regions which are formed in the single crystal of silicon for forming the seven integrated components of the device according to the present invention have generally the following characteristics:

| | |
|---|---|
| $p^-$ tubs regions: | dopant B; $8 \times 10^{12} \leq Q \leq 2 \times 10^{13}$ cm$^{-2}$; |
| n body regions of P-DMOS, of base of PNP and of drain of N-DMOS: | dopant P; $10^{13} \leq Q \leq 3 \times 10^{-}$cm$^{-2}$; |
| p regions of body of the N-DMOS, of base of the NPN, of source and drain of the P-MOS and of emitter of the PNP: | dopant B; $4 \times 10^{13} \leq Q \leq 7 \times 10^{13}$ cm$^{-2}$; |
| n$^+$ regions relative to the shallow diffusions: | dopant As; $10^{15} \leq Q \leq 10^{16}$ cm$^{-2}$. |

It is intended that the treatment conditions, as well as the values of the physical parameters of the regions and of the layers wherever indicated throughout the whole specification, are referred to conditions and values particularly preferred according to an embodiment of the device of the present invention using the mentioned substrate material. Therefore, they should not be intended as limitations of the present invention.

Naturally the fabrication process of the device according to the present invention has been described for the particular instance that the integrated circuit contain all the seven different components. As already said before and in particular in relation to the illustration of some practical examples of utilization of devices made in accordance with the present invention, in many applications the presence of all seven different components is not required by the circuit, therefore, the devices contemplated by the present invention may not contain necessarily all seven components but they are characterized by the fact that unlike the devices of the prior art, they contain at least a vertical bipolar PNP junction transistor with isolated collector and a vertical bipolar NPN junction transistor or a low leakage diode together with at least a lateral P-MOS or N-MOS transistor or a vertical N-DMOS or P-DMOS transistor.

What we claim is:

1. An integrated semiconductor circuit formed on a single monolithic substrate of semiconductor material comprising:
   a pair of vertical complementary DMOS transistors;
   a CMOS transistor structure;
   a vertical PNP bipolar junction transistor with isolated collector;
   a vertical NPN bipolar junction transistor; and
   a low leakage integrated diode having a heavily doped surrounding wall region contacting a second heavliy doped bottom anode region.

* * * * *